United States Patent [19]

Godard

[11] Patent Number: 4,654,861

[45] Date of Patent: Mar. 31, 1987

[54] METHOD AND DEVICE FOR MEASURING PHASE JITTER ON A TRANSMISSION CHANNEL

[75] Inventor: Dominique Godard, Le Rouret, France

[73] Assignee: International Business Machines Corp., Armonk, N.Y.

[21] Appl. No.: 746,500

[22] Filed: Jun. 19, 1985

[30] Foreign Application Priority Data

Jun. 28, 1984 [EP] European Pat. Off. ............ 84430026

[51] Int. Cl.$^4$ ............................................. H04B 17/00
[52] U.S. Cl. .................................. 375/10; 324/83 R; 371/22; 379/6
[58] Field of Search ....................... 375/10, 13, 15, 83, 375/118, 14; 455/67, 226; 371/15, 22, 27; 370/14, 17; 364/487, 514, 517, 484, 486, 572; 381/36, 37; 179/175.3 R; 324/58 A, 83 R, 83 D

[56] References Cited

U.S. PATENT DOCUMENTS 3,546,588 12/1970 Campbell, Jr. ........................ 375/10
3,711,773 1/1973 Hekimian et al. ................. 324/83 R
3,737,766 6/1973 Lubarsky, Jr. .................... 324/57 R

OTHER PUBLICATIONS

Elektronik Und Maschinenbau, vol. 95, No. 2, 1978, Reutlingen; F. Coenning, "Megerate fur die Datenubertragungstechnik", pp. 82–88.

Primary Examiner—Robert L. Griffin
Assistant Examiner—M. Huseman
Attorney, Agent, or Firm—John B. Frisone

[57] ABSTRACT

A sinusoidal test signal of a given frequency is applied by the generator 12 to the transmission channel 10. The output signal from the channel is sampled at 16 and fed to a Hilbert transformer 20 through an ADC 18. The sampled outputs from the Hilbert transformer are fed to a device 26 which derives therefrom the phase of the received signal. The phase of the test signal generated at 30–34 is subtracted from that of the output signal from device 26 and the resultant signal is fed to a phase filter 36, which removes therefrom the phase intercept and frequency shift components. The output from filter 36 is fed to a predictive filter 40 which removes the residual noise therefrom. A detector 42 measures the variations of the phase jitter values provided by predictive filter 40.

5 Claims, 4 Drawing Figures

METHOD AND DEVICE FOR MEASURING PHASE JITTER ON A TRANSMISSION CHANNEL

DESCRIPTION

1. Technical Field

This invention relates to data transmission systems and, more particularly, to a method and device for measuring the phase jitter that affects data sent over a transmission channel.

2. Background Art

A typical data transmission system comprises a transmitter and a receiver interconnected by means of a transmission channel. The transmitter receives from an associated data terminal equipment (DTE) the data to be transmitted, converts same into pulses suitable for transmission and then transmits the pulses over the channel. The receiver converts the pulses received from the channel back into data, and then transfers the data to an associated DTE. In practice, mainly for reasons of cost, common carrier telephone lines are generally used as a transmission channel. However, voiceband lines are poorly suited to the transmission of pulses where it is desired to achieve high speeds and very low error rates. It will readily be appreciated that the design of the transmitting and receiving equipment, and particularly the selection of the pulse characteristics to be used and the techniques to be employed to extract data from the received pulses, are largely dependent on the transmission channel parameters affecting transmission of the pulses.

Group delay distortion, frequency shift and phase jitter are some of the parameters affecting the transmission of signals over a voiceband channel. These parameters are described, for example, in the Bell System Technical Reference entitled "Transmission Parameters Affecting Voiceband Data Transmission—Description of Parameters", PUB 41008, July 1974. Said parameters affect the transmission of signals to varying degrees, and data transmitters and receivers usually are designed to compensate for their effects, at least within well-defined limits.

In high-speed data transmission systems, phase jitter is an important parameter whose effects must be compensated for. One of the techniques used at the present time to continuously compensate for phase jitter during normal data transmission is described in French Patent FR-A-2,296,322. A disadvantage of these techniques is that they compensate for phase jitter only if it varies within known limits, typically when its amplitude does not exceed 15° peak-to-peak. If it exceeds this limit, a large number of errors will occur and the transmission of data must be interrupted to make a diagnosis of the system.

Recent developments in the fields of integrated circuits and microprocessors have made it possible to incorporate diagnostic systems in modems (including each a transmitter and a receiver) so that data transmission system operations can be monitored and malfunctions diagnosed. Such a diagnostic system is described in an article by S. Huon and R. Smith entitled "Network Problem Determination Aids in Microprocessor-Based Modems", in IBM Journal of Research and Development, Vol. 25, No. 1, January 1981. In this system, measurements of the received signal are continuously taken to determine its quality and the latter is reported to the host system controlling the network into which the data transmission system is incorporated. However, no specific indication of the magnitude of the phase jitter is provided, and it was found desirable to complement the information relating to the quality of the received signal by means of an accurate phase jitter measurement to enable transmission system malfunctions to be correctly diagnosed.

CCITT Recommendation 091 entitled "Essential Clauses for An Instrument to Measure Phase Jitter on Telephone Circuits" proposes a method of measuring phase jitter which consists, in particular, in sending a test signal over the transmission channel to be tested and in then determining the amount of phase jitter from the received test signal. This phase jitter measurement includes the steps of:

band limiting the received signal around the test signal frequency;

amplifying and limiting the signal to remove incident amplitude modulation therefrom; and detecting the zero crossings of an error signal supplied by a phase-locked loop.

The main disadvantage of the above method is that it does not make it possible to achieve a sufficient degree of accuracy if used with digital techniques; for example, zero crossings are difficult to detect accurately by digital means.

SUMMARY OF THE INVENTION

It is the object of this invention to provide a method and a device for taking very accurate phase jitter measurements and which can readily be implemented in a digital environment.

The present method of measuring phase jitter on a transmission channel is characterized in that it includes the steps of:

applying a sinusoidal test signal of a given frequency to an end of the transmission channel, determining the phase of the test signal received at the other end of the transmission channel, generating a phase value representative of that of the transmitted test signal, subtracting said phase value from that of the received test signal, thereby providing a first signal termed phase signal, filtering said first phase signal to remove therefrom the phase intercept and frequency shift components, thereby providing a second phase signal, passing said second phase signal through a low-pass filter, thereby providing a third phase signal, and passing said third phase signal through a predictive filter to derive therefrom an estimated phase jitter value.

In accordance with another aspect of the invention, the determination of the phase of the received test signal includes the steps of:

determining the in-phase and quadrature components of said received test signal, and deriving the phase of the received test signal from said components.

The invention also provides a device for implementing the inventive method.

The foregoing and other objects, features and advantages of the invention will be apparent from the following more particular description of a preferred embodiment of the invention as illustrated in the drawings.

DETAILED DESCRIPTION OF THE INVENTION

Figure 1:
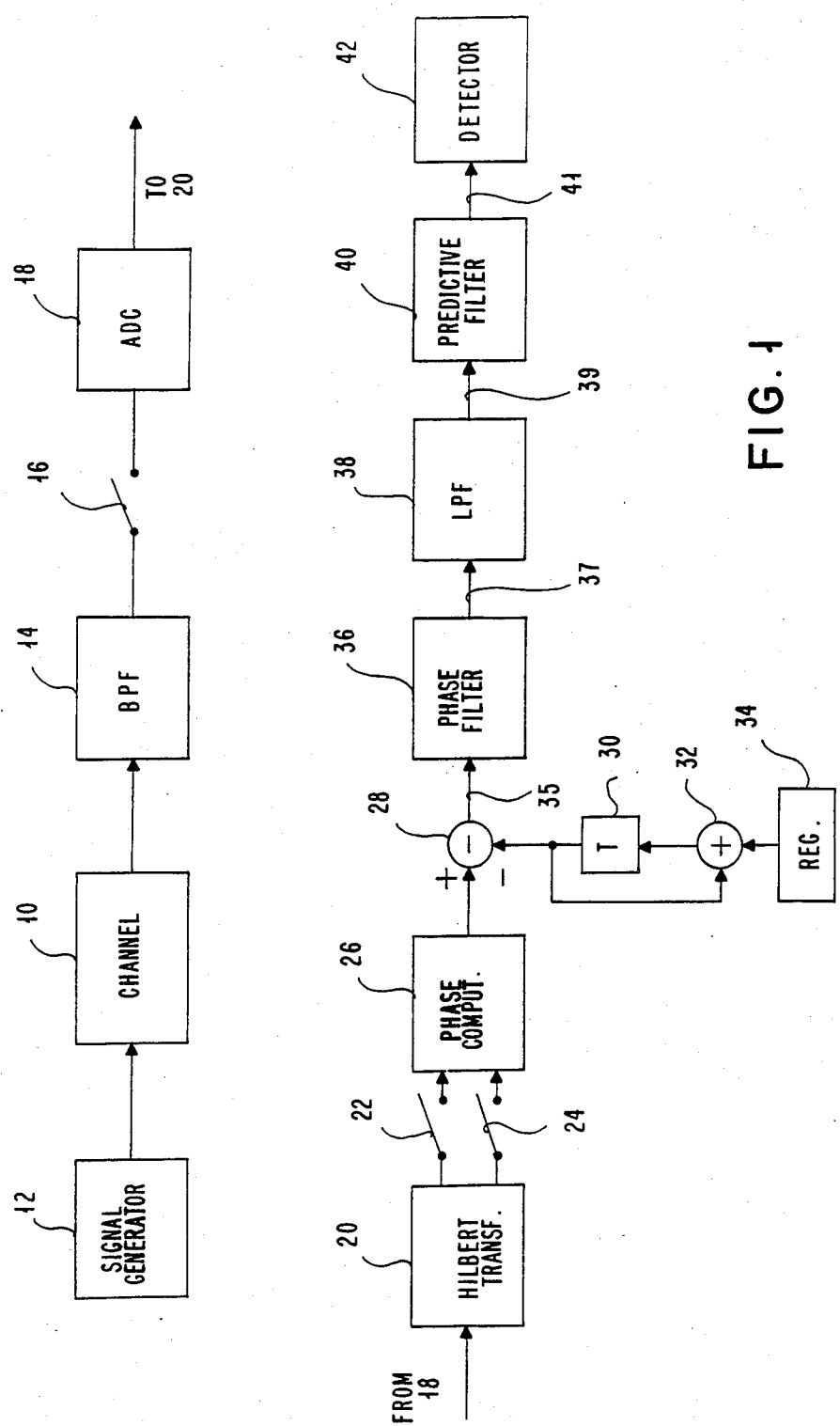
FIG. 1 is a schematic illustration of a measuring device in accordance with the invention.

Referring now to FIG. 1, block 10 represents the transmission channel whose phase jitter is to be measured.

The method of the present invention basically consists in applying a test signal to one end of the channel and in analyzing the signal received at the other end. The test signal used is a sine wave of a given frequency, preferably in the band of channel frequencies in which attenuation is minimal, that is, in the band of 1000–2000 Hz. This test signal can be generated by any suitable means such as the signal generator shown as block 12 in FIG. 1.

The signal received from transmission channel 10 is fed to an analog bandpass filter (BPF) 14 which limits the passband of the signal to the voiceband. Such a filter is well known in the art and is provided, for example, at the input of all voiceband modems. The output from filter 14 is sampled by a sampling device 16 and converted into digital form by an analog-to-digital converter (ADC) 18. The output form ADC 18 is fed to a Hilbert transformer 20 which generates the in-phase and quadrature components of the sampled signal. These two components are respectively sampled at periodic intervals by a couple of decimation devices 22 and 24, and are then fed to a phase computing device 26, to be described in connection with FIG. 2.

The output from device 26 is applied to the (+) input of a digital subtractor 28 whose (−) input is connected to the output of a delay element 30. The input of delay element 30 is connected to the output of a digital adder 32 which has an input connected to the output of delay element 30 and whose other input receives the content of a register 34.

The output from subtractor 28 is fed via a line 35 to a second-order phase filter 36, to be described in connection with FIG. 3. The output from phase filter 36 is fed via a line 37 to a low-pass digital filter (LPF) 38, which has a cutoff frequency of 300 Hz. The output from LPF 38 is fed via a line 39 to a digital predictive filter 40, to be described in connection with FIG. 4. The output from predictive filter 40 is fed via a line 41 to a peak value detector 42 which provides the peak-to-peak value of the phase jitter.

Figure 2:
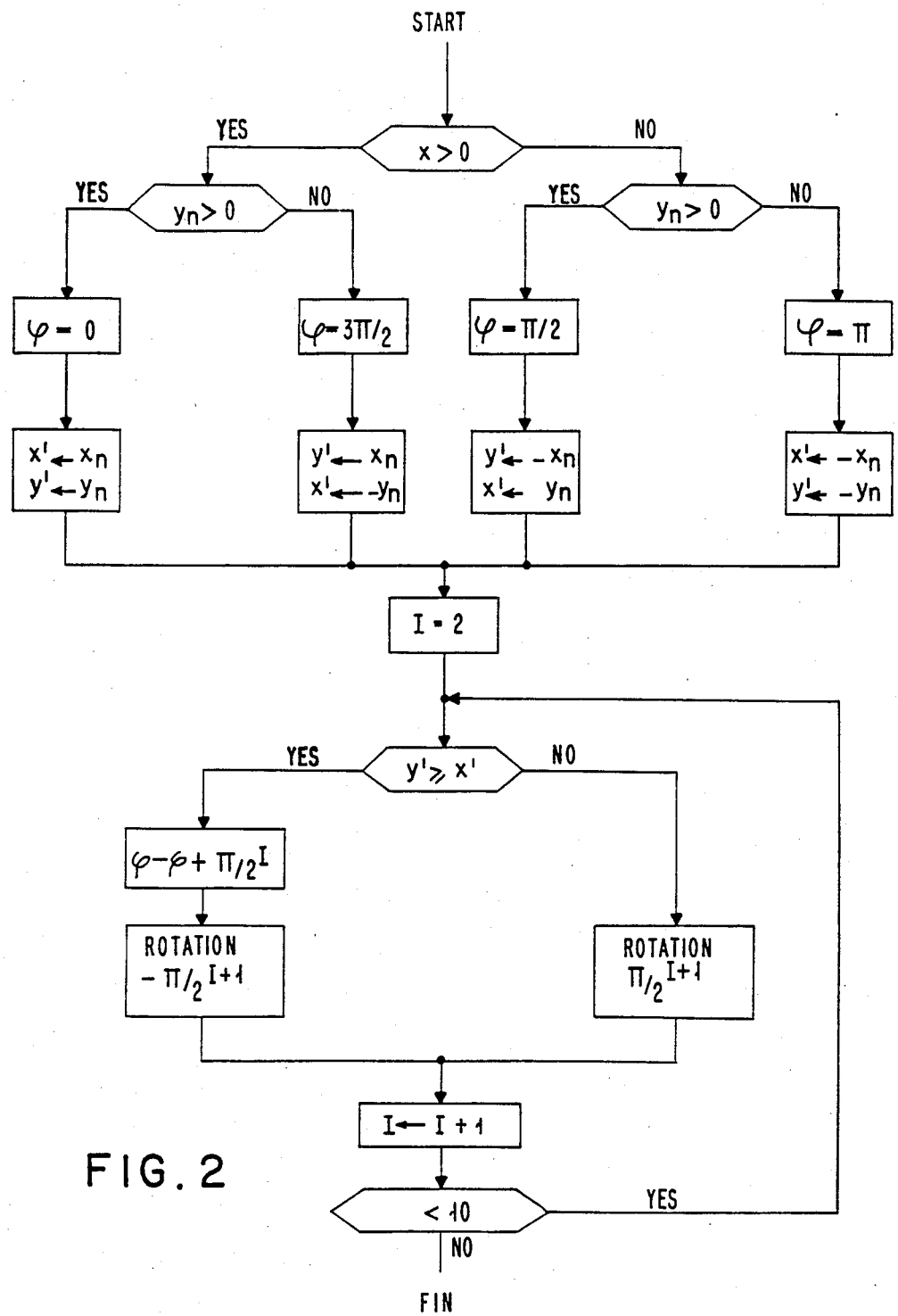
FIG. 2 is a diagram illustrating the operation of phase computing device 26 of FIG. 1.
Figure 3:
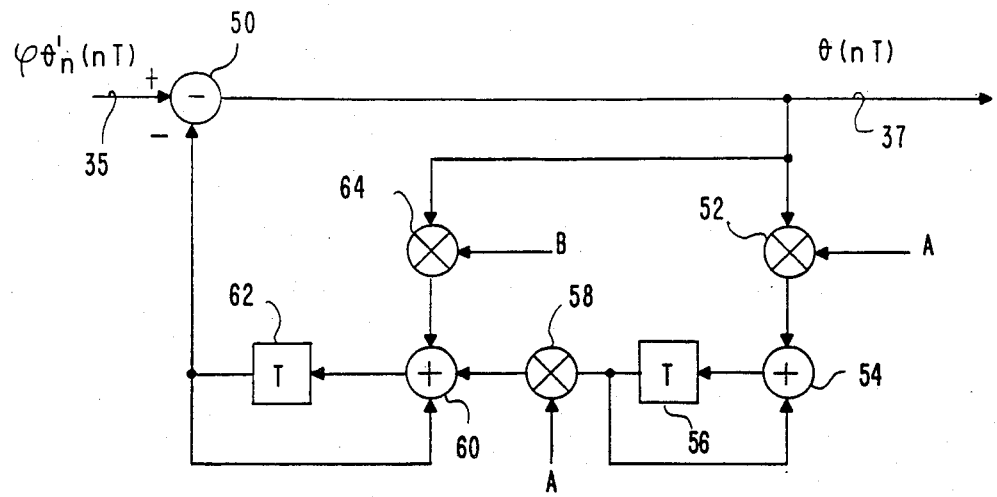
FIG. 3 shows an exemplary embodiment of phase filter 36 of FIG. 1.
Figure 4:
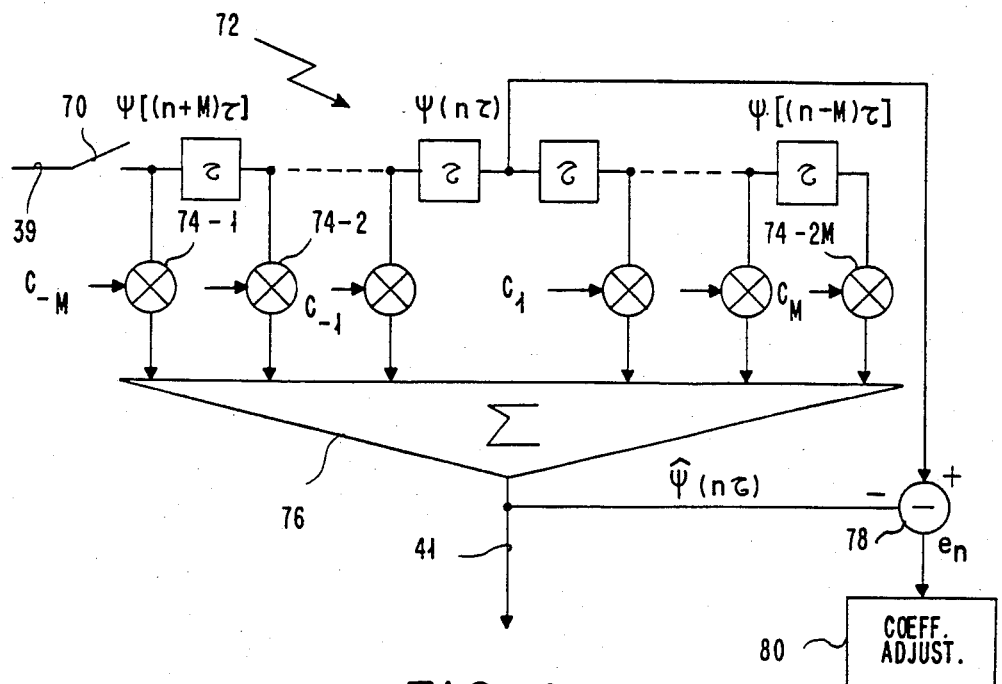
FIG. 4 shows an exemplary embodiment of predictive filter 40 of FIG. 1.

All devices shown in FIG. 1, other than those described with reference to FIGS. 2 to 4, are well known in the art and employed in most modems. In view of their conventional nature, these devices will not be described in greater detail hereafter.

The operation of the device schematically shown in FIG. 1 will now be described. The test signal, written s(t), generated by signal generator 12 can be expressed as $$s(t) = A_o \cos 2\pi f_o t \qquad (1)$$

where
$A_o$ and $f_o$ are the amplitude and the phase, respectively, of the transmitted test signal.

Because of disturbances introduced by the channel, the received test signal, written r(t), is different from the transmitted test signal, s(t). In the absence of nonlinear distortions, signal r(t) can be expressed as $$r(t) = A_1(1+m(t)) \cos(2\pi f_o t + \phi_1 + \phi(t)) + n(t) \qquad (2)$$

where
$A_1$ and $\phi_1$ are the amplitude and the phase of the channel at frequency $f_o$, respectively, m(t) is the incident amplitude modulation introduced by the channel, $\phi(t)$ is the incident phase modulation introduced by the channel, and n(t) represents noise.

The incident phase modulation can be written as $$\phi(t) = \phi_o + 2\pi \Delta f t + \sum_{k=1}^{N} j_k \cos(2\pi f_k t + \phi_k) \qquad (3)$$

where
$\phi_o$ is a constant representing the phase intercept introduced by the channel, $\Delta f$ is the frequency shift introduced by the channel, and $j_k$, $f_k$ and $\phi_k$ represent N independent components of the phase jitter.

Relations (2) and (3) above are well-known in the art and are discussed, for example, in the Bell System publication mentioned earlier, in which the terms of relations (2) and (3) (respectively designated (4.2) and (4.3) therein) are defined and described.

The problem addressed by the invention is the measurement of the extremes of the sum $$\sum_{k=1}^{N} j_k \cos(2\pi f_k t + \phi_k)$$

in relation (3).

the test signal received from transmission channel 10 is passed through bandpass filter (BPF) 14 which limits the signal to its components in the voiceband. The received signal, r(t), is then sampled at a rate which satisfies the sampling theorem and is, in the example shown in FIG. 1, equal to 6/T, with 1/TA=2400 Hz. The sampled signal is then fed to Hilbert transformer 20, which derives therefrom in a known manner the in-phase and quadrature components. These components are in turn fed to phase computation device 26, which derives therefrom the phase of the received test signal. Since the passband of the signal representative of the phase of the received signal is less than that of the received signal, 6/T phase signal samples per second are unnecessary. This is the reason why decimation devices 22 and 24 have been inserted between Hilbert transformer 20 and phase computation device 26. Devices 22 and 24 use only one out of every six samples supplied by Hilbert transformer 20 and thus provide the in-phase and quadrature components, respectively, at the rate of 1/T. These components are respectively written $x_n$ and $y_n$, where n is the time index, with n=1, 2, 3, ... Phase computation device 26 supplies samples of the phase of the received signal, as will be later described with reference to FIG. 2.

At time t=nT, the phase value supplied by device 26 takes the form $$\phi(nT) = \phi_o + 2\pi f_o nT + 2\Delta f nT + \sum_{k=1}^{N} j_k \cos(2\pi f_k nT + \phi_k) + \Delta\phi(nT) \quad (4)$$

where $\Delta\phi$ (nT) is the influence of noise n(t).

In relation (4), which expresses the phase of the transmitted signal, the term $2\pi f_o nT$ is generated by the assembly consisting of delay element 30, which introduces a T-sec. delay, adder 32 and register 34, and is subtracted from phase value $\phi(nT)$ by subtractor 28. Phase difference $2\pi f_o T$ is a constant whose value, converted into digital form, is stored in register 34 and added every T seconds to the content of delay element 30 by adder 32. Thus, phase value $\phi'(nT)$ is obtained at the output of subtractor 28:

$$\phi'(nT) = \phi_o + 2\pi f nT + \sum_{k=1}^{N} j_k \cos(2\pi f_k nT + \phi_k) + \Delta\phi(nT) \quad (5)$$

Phase value $\phi'(nT)$ is fed to phase filter 36, which removes therefrom the terms $\phi_o$ and $2\pi\Delta f nT$ representing the phase intercept and the frequency shift, respectively. After convergence, there is obtained at the output of the filter a phase value $\theta(nT)$ defined as:

$$\theta(nT) = \sum_{k=1}^{N} j_k \cos(2\pi f_k nT + \phi_k) + \Delta\theta(nT) \quad (6)$$

where $\Delta\theta(nT)$ is the residual noise.

Since the phase jitter components are concentrated in the band of 20-300 Hz., low-pass filter (LPF) 38 is provided to limit $\theta(nT)$ to its components of less than 300 Hz. In the exemplary embodiment of FIG. 1, LPF 38 is a 15-tap digital symmetrical transversal filter. The output from LPF 38 contains the phase jitter components of interest as well as residual noise. In some cases, a measurement of the output from LPF 38 may suffice to provide a good indication of the phase jitter, but where the transmission channel is used by very high speed modems (12,000 bps and up), phase jitter is an important impairment which must be measured with greater accuracy. Accordingly, predictive filter 40 has been provided to remove residual noise from the output signal from filter 38, and supplies a phase value which is an accurate representation of the phase jitter. The peak-to-peak amplitude of the phase jitter is measured by detector 42 which compares with one another the successive samples supplied by predictive filter 40 during the test, the indicates upon completion of the test the maximum amplitude variation between the samples.

An exemplary embodiment of phase computing device 26 will now be described with reference to FIG. 2, which is a diagram illustrating the method used by that device. In said method, the phase $\phi(nT)$ of the signal defined by its in-phase and quadrature components, $x_n$ and $y_n$, is determined by successively rotating the vector of coordinates $(x_n, y_n)$ around $\pi/4$.

When a couple of components such as $(x_n, y_n)$ are fed to device 26, the sign of $x_n$ is tested.

If $x_n$ is positive, the sign of $y_n$ is tested. If $y_n$ is positive, a variable $\phi$ is forced to zero and two intermediate variables x' and y' take on values $x_n$ and $y_n$, respectively.

If $y_n$ is negative, $\phi$ is forced to $3\pi/2$ while variables x' and y' take on values $x_n$ and $-y_n$, respectively.

If $x_n$ is negative, the sign of $y_n$ is tested as above. If $y_n$ is positive, $\phi$ is forced to $3\pi/2$ while variables x' and y' take on values $y_n$ and $-x_n$, respectively. If $y_n$ is negative, $\phi$ is forced to $\pi$ while variables x' and y' take on values $-x$ and $-y$, respectively. After the values of variables x' and y' have been initialized as defined above, a counting variable I is forced to 2 and x' and y' are compared. If y' is higher than or equal to x', variable $\phi$ takes on the value defined during the preceding step plus $\pi/2^I$. The vector of components x' and y' is then rotated through an angle equal to $-\pi/2^{I+1}$, which yields new values of x' and y', as shown below:

new x' ← old x' cos $\pi/2^{I+1}$ + old y' sin $\pi/2^{I+1}$ new y' ← old y' cos $\pi/2^{I+1}$ − old x' sin $\pi/2^{I+1}$ If y' is less than x', the vector of components x' and y' is rotated through $\pi/2^{I+1}$, resulting in new values of x' and y':

new x' ← old x' cos $\pi/2^{I+1}$ − old y' sin $\pi/2^{I+1}$ new y' ← old y' cos $\pi/2^{I+1}$ − old x' sin $\pi/2^{I+1}$ When new values of x' and y' have been obtained as a result of either of the above rotations, counting variable I is increased by unity. The value of I is tested, and if found to be less than some threshold, set to 10 in this example, x' and y' are compared and the subsequent operations are performed, using the new values of I, x' and y'. When I reaches the threshold, the operation is complete, with the last value of $\phi$ being the phase value it was desired to find. Those skilled in the art will appreciate that phase computing device 26 can be implemented in any suitable manner using the method illustrated by the diagram of FIG. 2 just described.

An exemplary embodiment of phase filter 36 will now be described with reference to FIG. 3. Phase value $\phi'(nT)$ is applied via line 35 to the (+) input of a binary subtractor 50 whose output is connected to output line 37 of phase filter 36 and to an input of a multiplier 52 whose other input receives the value of a coefficient A converted to digital form. The output from multiplier 52 is applied to an input of an adder 54 whose output is fed to a delay element 56 which introduces a T-second delay and whose output is connected to the other input of adder 54 and to an input of a multiplier 58, whose other input receives the value of coefficient A converted to digital form. The output from multiplier 58 is fed to an input of 3-input adder 60 whose output is fed to a delay element 62 which introduces a T-second delay. The output from delay element 62 is fed to the (−) input of subtractor 50 and to another input of adder 60. The output from subtractor 50 is additionally applied to an input of a multiplier 64 whose other input receives the value of a coefficient B converted to digital form and whose output is connected to the third input of adder 60.

Pulse filter 36 is a second-order recursive filter whose transfer function is defined as $$\frac{(1 - Z^{-1})^2}{1 - (2 - B)Z^{-1} + (1 + A^2 - B)Z^{-2}}$$

where $Z^{-1}$ corresponds to a T-second delay.

The coefficients of this filter are such that:
it will pass the phase jitter components;
it will suppress the phase intercept and frequency shift components; and
its convergence speed will not be excessively slow.

From these three characteristics, the value of the coefficients can be derived using conventional methods such as those described in the articles entitled "Equiripple and Minima Approximation for Recursive Digital Filters", in IEEE Transactions on Acoustics, Speech, Signal Processing, Vol. ASSP-22, pp. 99-111, April 1974, and "A Design Algorithm for Constrained Equiripple Digital Filters", in the same reference, Vol. ASSP-30, pp. 206-211, April 1982. In the exemplary embodiment shown in FIG. 3, the following values were used:

A = 0.09961
B = 0.049805
T = 1/2400

Referring now to FIG. 4, an exemplary embodiment of predictive filter 40 of FIG. 1 will be described. Let $\Psi(nT)$ be the output signal from low-pass filter 38. From relation (6), since frequencies $f_k$ are less than 300 hz, the output from filter 38 can be written $$\Psi(nT) = \sum_{k=1}^{N} j_k \cos(2\pi f_k nT + \phi_k) + \Delta\Psi(nT) \quad (8)$$

where
$\Delta\Psi$ is simply the filtered version of residual noise $\Delta\theta(nT)$ in relation (6).

The signal defined by relation (8) is band limited to 300 Hz and, therefore, can be observed at a rate lower than 1/T, such as $1/\tau = \frac{1}{4}T$ in this example. Note that the transfer function of the cascaded phase filter 36 and low-pass filter 38 is flat over the band from 0 to 300 Hz, except for a sharp null at the DC component. The correlation between successive noise samples is, consequently, very small. On the other hand, the phase jitter components are highly correlated. The effects of noise can be smoothed out by deriving an estimated value $\hat{\Psi}(n\tau)$ of $\Psi(n\tau)$ from previous samples of the output signal from low-pass filter 38.

The estimated value $\hat{\Psi}(n\tau)$ of $\Psi(n\tau)$ is written in the form $$\hat{\Psi}(n\tau) = \sum_{p=-M, p\neq 0}^{N} \Psi[(n-p)\tau]C_p \quad (9)$$

where
$C_p$ represents the real-valued coefficients of a transversal filter whose taps have a $\tau$-second spacing, with the center coefficient set at zero. The value of the coefficients is adaptively adjusted to minimize the mean-squared error $Ee_n^2$, where E is the mathematical expectation, or mean value, and error $e_n$ is defined as $$e_n = \Psi(n\tau) - \hat{\Psi}(n\tau) \quad (10)$$

The value of coefficients $C_p$ is adjusted in successive iterations, using the stochastic method defined as $$C_p(n+1) = C_p(n) + 1e_n\Psi[(n-p)\tau], p \neq 0$$

where 1 is the iteration step whose value will be discussed later. The predictive filter shown in FIG. 4 is a conventional Wiener filter which uses the above relations. The output from low-pass filter 38 is fed via line 39 to a decimation device 70 which passes only one out of every four samples supplied by filter 38. The output from decimation device 70 is applied to a digital delay line 72 comprising 2M+1 taps with a $\tau$-sec spacing. The outputs from all taps except the center tap are respectively fed to an input of 2M multipliers 74-1 to 74-2M, the other input of each of which receives the 2M coefficients $C_{-M}, \ldots, C_{-1}, \ldots, C_1, \ldots, C_M$, respectively. The outputs from multipliers 74-1 to 74-2M are fed to the inputs of a summing device 76 whose output is fed via line 41 to the detector 42 of FIG. 1. The output from device 76 is also applied to the (−) input of a subtractor 78 whose (+) input is connected to the center tap of delay line 72 and whose output is fed to a coefficient adjusting device 80 which provides the values of the coefficients applied to multipliers 74-1 to 74-2M.

The initial value of the coefficients is zero. At the time coefficient $\Psi(n\tau)$ reaches the center tap, the samples $$\Psi[(n-M)\tau], \ldots \Psi[(n-1)\tau], \Psi[(n+1)\tau], \ldots$$
$$\Psi[(n+M)\tau]$$

are distributed among the other taps of delay line 72 as shown in FIG. 4, and the coefficients take on values $C_p(n)$.

The estimated value $\hat{\Psi}(n\tau)$, determined in accordance with relation (9), is then obtained at the output of summing device 76. This estimated value is subtracted from $\Psi(n\tau)$ in subtractor 78, which supplies error $e_n$ as its output. Error $e_n$ is fed to adjusting device 80 which computes the new coefficient values in accordance with relation (9).

At the next sampling instant, sample $\Psi[(n+1)\tau]$ has reached the center tap and an estimated value $\hat{\Psi}[(n+1)\tau]$ of $\Psi[(n+1)\tau]$ is computed using the coefficient values $C_p(n+1)$ derived from error $e_n$ during the preceding iteration. The iteration process continues in a similar manner.

For best results, delay line 72 should have as many taps as possible. Very good results have been obtained with a 27-tap delay line. The value of the iteration step is chosen empirically in a conventional manner by making a compromise between the desired degree of accuracy and the desired period of time within which convergence of the iterative process is to be achieved.

Note that most of the components of the present system already exist in conventional modems, and that the invention only requires a minimum of additional equipment. Also note that the sampling rates mentioned earlier are compatible with those used in most modems; for example, the rate of 1/T=2400 is widely used in modems.

While the invention has been shown and described with reference to a preferred embodiment thereof it will be understood by those skilled in the art that various changes in form and details may be made therein without departing from the spirit and scope of the invention.

What is claimed is:

1. A method of measuring phase jitter including phase intercept and frequency shift components on a transmission channel, characterized in that it comprises the steps of:

applying a sinusoidal test signal of a given frequency to an end of the transmission channel, determining the phase of the test signal received at the other end of the transmission channel, generating a phase value representative of that of the transmitted test signal, subtracting said phase value from that of the received test signal, thereby providing a first phase signal, filtering said first phase signal to remove therefrom the phase intercept and frequency shift components, thereby providing a second phase signal, passing said second phase signal through a low-pass filter, thereby providing a third phase signal, and passing said third phase signal through a predictive filter to derive therefrom an estimated phase jitter value.

2. The method of claim 1, characterized in that the determination of the phase of the received test signal comprises the steps of:

determining the in-phase and quadrature components of the received test signal, and deriving the phase of the received test signal from said components.

3. A device for measuring phase jitter including phase intercept and frequency shift components on a transmission channel, characterized in that it comprises:

means for generating a sinusoidal test signal of a given frequency and for applying said test signal to one end of the transmission channel, means for determining the phase of the test signal received at the other end of the transmission channel, means for generating a phase value representative of that of the transmitted test signal, means for subtracting said phase value from that of the received test signal, to thereby provide a first phase signal, a second-order recursive filter for removing from said first phase signal the phase intercept and frequency shift components, to thereby provide a second phase signal, a low-pass filter for filtering said second phase signal, to thereby provide a third phase signal, and an adaptive predictive filter for deriving from said third phase signal an estimated phase jitter value.

4. The device of claim 3, characterized in that said means for determining the phase of the received test signal comprise:

a Hilbert transformer for determining the in-phase and quadrature components of the received test signal, and means for computing the phase of the received test signal from said components.

5. The device of claim 4, characterized in that the received signal is sampled at a first sampling rate before it is applied to said Hilbert transformer; in that the in-phase and quadrature components are sampled at a second rate which is a sub-multiple of said first rate; and in that the third phase signal is sampled at a third rate which is a sub-multiple of said second sampling rate.

* * * * *